United States Patent
Wu et al.

(10) Patent No.: US 8,882,304 B2
(45) Date of Patent: Nov. 11, 2014

(54) ILLUMINATING DEVICE AND PACKAGING METHOD THEREOF

(75) Inventors: Hsiang-Chen Wu, Taoyuan Hsien (TW); Ching-Chuan Shiue, Taoyuan Hsien (TW); Chun-Lang Chen, Taoyuan Hsien (TW); Chun-Huang Cheng, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 415 days.

(21) Appl. No.: 12/816,085

(22) Filed: Jun. 15, 2010

(65) Prior Publication Data
US 2010/0321920 A1 Dec. 23, 2010

(30) Foreign Application Priority Data
Jun. 23, 2009 (TW) ................................ 98120926 A

(51) Int. Cl.
*F21V 5/00* (2006.01)
(52) U.S. Cl.
USPC ................................ 362/311.02; 362/311.14
(58) Field of Classification Search
USPC ............. 362/296.05, 311.02, 311.06, 311.14, 362/343, 344, 356, 455
See application file for complete search history.

(56) References Cited

U.S. PATENT DOCUMENTS

| | | | |
|---|---|---|---|
| 7,264,380 B1 * | 9/2007 | Monroe et al. | 362/356 |
| 8,083,364 B2 * | 12/2011 | Allen | 362/311.02 |
| 2003/0008431 A1 | 1/2003 | Matsubara | |
| 2004/0109310 A1 | 6/2004 | Galli | |
| 2006/0034084 A1 * | 2/2006 | Matsuura et al. | 362/344 |
| 2006/0291246 A1 * | 12/2006 | Hattori et al. | 362/84 |
| 2007/0080357 A1 | 4/2007 | Ishii | |
| 2007/0108460 A1 | 5/2007 | Lee | |
| 2007/0158669 A1 | 7/2007 | Lee | |
| 2007/0246729 A1 | 10/2007 | Park | |
| 2008/0205035 A1 * | 8/2008 | Asvadi et al. | 362/311 |
| 2009/0046473 A1 | 2/2009 | Tsai | |
| 2009/0147498 A1 * | 6/2009 | Park | 362/294 |
| 2009/0267104 A1 | 10/2009 | Hsu | |

FOREIGN PATENT DOCUMENTS

| | | |
|---|---|---|
| CN | 101114684 A | 1/2008 |
| CN | 101213675 A | 7/2008 |
| TW | M318795 U | 9/2007 |
| TW | M348889 U | 1/2009 |

\* cited by examiner

*Primary Examiner* — Y My Quach Lee
(74) *Attorney, Agent, or Firm* — Muncy, Geissler, Olds & Lowe, P.C.

(57) ABSTRACT

An illuminating device includes a substrate, an illuminating element, at least one barricade and at least one cover layer. The illuminating element is disposed on the substrate. The barricade is protruded from a surface of the substrate and disposed around the illuminating element continuously or discontinuously to form a first accommodating area. The cover layer is disposed in the first accommodating area for covering the illuminating element.

21 Claims, 5 Drawing Sheets

ILLUMINATING DEVICE AND PACKAGING METHOD THEREOF

CROSS REFERENCE TO RELATED APPLICATIONS

This Non-provisional application claims priority under 35 U.S.C. §119(a) on Patent Application No(s). 098120926 filed in Taiwan, Republic of China on Jun. 23, 2009, the entire contents of which are hereby incorporated by reference.

BACKGROUND OF THE INVENTION

1. Field of Invention

The present invention relates to an illuminating device and its packaging method. More particularly, the present invention relates to an illuminating device and a packaging method thereof, which can simplify the packaging process and provide accurate alignment.

2. Related Art

As shown in FIG. 1, the conventional illuminating device 1 has a substrate 10, an insulation layer 11 disposed on the substrate 10, and an illuminating element 12 disposed on the insulation layer 11. Afterward, the illuminating element 12 is connected with a metal layer 13, which is disposed on the insulation layer 11, by wire bonding to establish electrical connection. The illuminating element 12 is finally enclosed by a packaging layer 14 to protect it from mechanical stress, heat, moisture or other adverse factors.

However, the alignment issue of the illuminating element 12 has to be considered when the illuminating element 12 is covered by the package layer 14. That is, the illuminating element 12 must be located in the center of the package layer 14. If not, the lighting efficiency, light uniformity, light shape and color temperature of the illuminating element 12 will be influenced. Unfortunately, in order to accurately aligning the illuminating element 12 in the center of the package layer 14, an additional mechanical apparatus is needed, which may increase the complexity and efficiency of manufacture as well as the production cost.

SUMMARY OF THE INVENTION

In view of the foregoing, the present invention provides an illuminating device, which can be fabricated though a simplified packaging process with accurate alignment, and a packaging method thereof.

To achieve the above, the illuminating device in accordance with the present invention includes a substrate, an illuminating element, at least one barricade and at least one cover layer. The illuminating element is disposed on the substrate. The barricade is protruded from a surface of the substrate, and disposed around the illuminating element continuously or discontinuously to define a first accommodating area. The cover layer is disposed in the first accommodating area for covering the illuminating element.

Furthermore, the first barricade is disposed around the illuminating element with the same or different distances. Preferably, the first or second accommodating area is an annular, circular, elliptic, triangular, rectangular, polygonal or irregular closed or non-closed area. The preferred material of the substrate is copper, aluminum, ceramics or high thermal conductivity material. The surface of the substrate can be a flat, convex or concave surface, and the surface of the substrate preferably includes a light reflective material.

The illuminating device further includes a second barricade, which is disposed around the first barricade continuously or discontinuously to define an annular second accommodating area between the first and second barricades. Preferably, the first or second barricade is flexible to cushion mechanical stress. Preferably, the height of the cover layer is lower than, equal to or higher than that of the first or second barricade.

The first or second barricade is preferably spherical, ellipsoid-shaped, annular, arc-shaped, cone-shaped, cubic, polyhedron-shaped or irregularity-shaped. The first or second barricade is flexible or inflexible, and the material of the first or second barricade includes silica gel, silicone, rubber, resin, glass, acryl, UV gel, light-permeable material, light-proof material or insulation material. Preferably, the first or second barricade is disposed on the substrate by dispensing, adhering, press molding or screen printing. Each of the first and second barricades individually has a first end close to the illuminating element and a second end opposite to the first end and away from the illuminating element, and the first and/or second end is coated with a light-refraction-index converting material in order to improving the light emitting efficiency of the illuminating device.

The cover layer can be disposed only in the first accommodating area or in the first and second accommodating areas simultaneously. The surface of the cover layer is a concave, convex, flat, mirror or rough surface. The material of the cover layer is light permeable. Moreover, the cover layer includes an optical lens layer, a gel layer or a composite material layer. The optical lens layer can be disposed on the gel layer, the composite material layer, the first barricade or the second barricade. Thus, the barricade can support and fix the optical lens layer. Otherwise, the composite material layer can be disposed on the gel layer or the illuminating element. The material of the optical lens layer can include glass, acryl, UV gel, quartz or highly light-permeable material. In addition, the composite material layer can include a filling gel and a composite material; furthermore, the composite material preferably includes a fluorescent material, a wavelength converting material or a non-crystal material. The composite material is dispersed in the filling gel uniformly, non-uniformly, with a gradually changing concentration, at the bottom, or at the top. As to the material of the filling gel, it includes epoxy, silicone, resin or insulation material.

To achieve the above, the packing method of the illuminating device in accordance with the present invention includes the steps of: providing a substrate; disposing an illuminating element on the substrate; disposing at least one first barricade on a surface of the substrate, wherein the first barricade is disposed around the illuminating element continuously or discontinuously to define a first accommodating area; and disposing a cover layer on the first accommodating area to cover the illuminating element.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
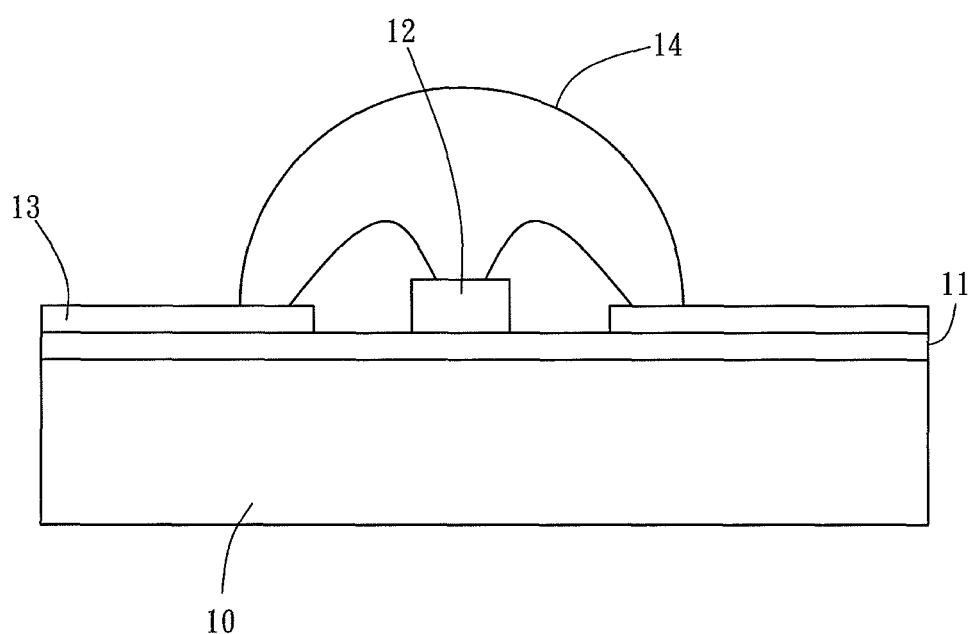
FIG. 1 is a cross section diagram of a conventional illuminating device.
Figure 2A:
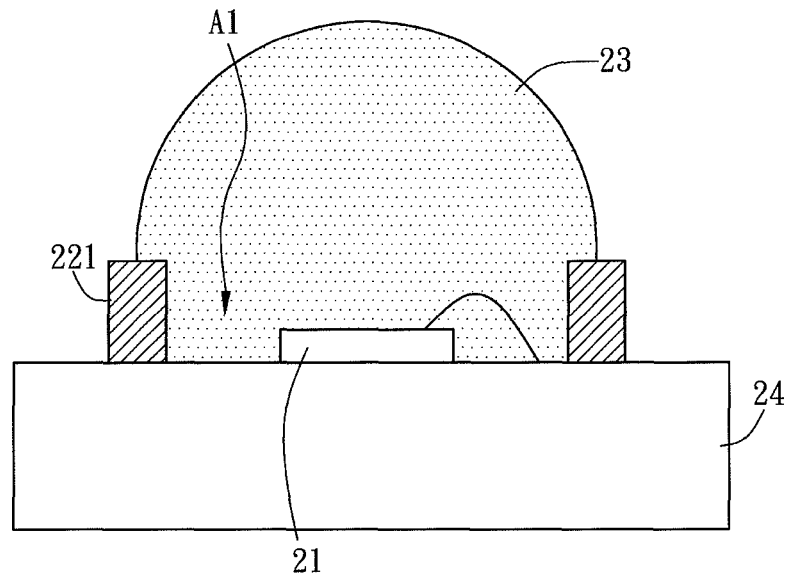
FIGS. 2A to 2F are cross section diagrams of an illuminating device in accordance with a preferred embodiment of the present invention.

As shown in FIG. 2A, the illuminating device in accordance with the present invention includes a substrate 24, an illuminating element 21, at least one first barricade 221 and at least one cover layer 23. The first barricade 221 is protruded from a surface of the substrate 24, and is disposed around the illuminating element 21 to define a first accommodating area A1. The cover layer 23 is disposed in the first accommodating area A1 for covering the illuminating element 21.

Furthermore, the material of the substrate 24 is copper, aluminum, ceramics or high thermal conductivity material, which has the feature of thermal conductivity and circuitry connection. The surface of the substrate can be a flat, convex or concave surface, and preferably the surface of the substrate includes the light reflective material. The first barricade 221 is disposed around the illuminating element 21 with the same distance so that the illuminating element 21 is in the center of the first accommodating area A1. In contrast, the first barricade 221 can also be disposed around the illuminating element 21 with different distances. The surface of the cover layer 23 is a convex surface. However, the surface is not limited to that, and it can be a concave, flat, mirror or rough surface. In addition, the height of the cover layer 23 is higher than that of the first barricade 221, but it still can be disposed with a height lower than or equal to that of the first barricade 221.

Figure 3A:
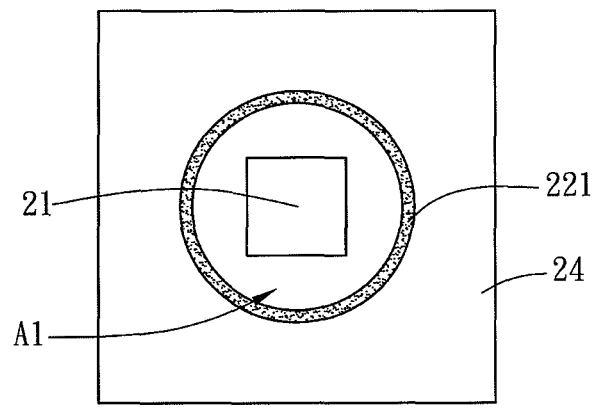
FIGS. 3A to 3C are top views of the illuminating device in accordance with the preferred embodiment of the present invention.
Figure 3B:
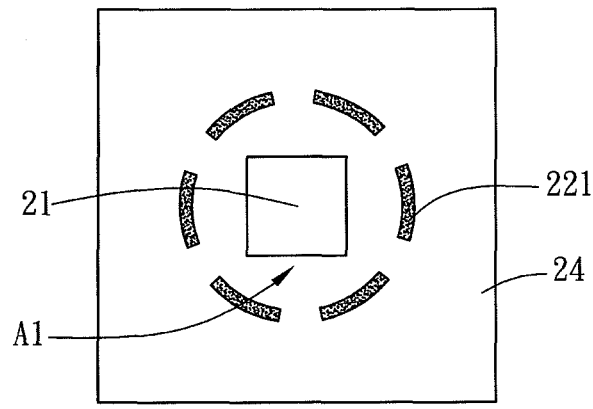

As shown in FIG. 3A, the first barricade 221 can be disposed around the illuminating element 21 continuously; however, as shown in FIG. 3B, it still can be disposed around the illuminating element 21 discontinuously. Discontinuous disposition of the first barricade 221 can not only prevent the bubble existed in the first accommodating area A1 while the cover layer 23 is filled into the first accommodating area A1, but also provide a path to release mechanical stress while the cover layer 23 is solidified.

As shown in FIGS. 3A and 3B, preferably, the first accommodating area A1 is circular; however, it still can be elliptic, triangular, rectangular, polygonal or irregular.

Figure 3C:
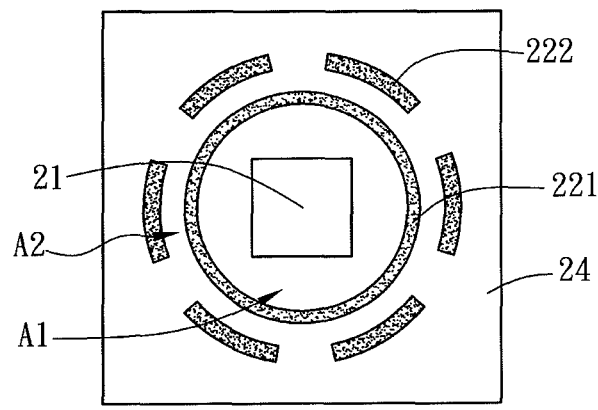

As shown in FIG. 3C, the illuminating device 21 can further include a second barricade 222, which is disposed around the first barricade 221 to define an annular second accommodating area A2 between the first barricade 221 and the second barricade 222. The second barricade 222 can, for example but not limited to, be disposed around the first barricade 221 discontinuously. Alternatively, it also can be disposed around the first barricade 221 continuously.

Preferably, the material of the first or second barricade is flexible and can be or not light permeable, such as silica gel, silicone, rubber, resin, glass, acryl, UV gel, light-permeable material, light-proof material or insulation material. Moreover, the first or second barricade can be spherical, ellipsoid-shaped, annular, arc-shaped, cone-shaped, cubic, polyhedron-shaped or irregularity-shaped. The first or second barricade can be disposed on the substrate by dispensing, adhering, press molding or screen printing.

Figure 2B:
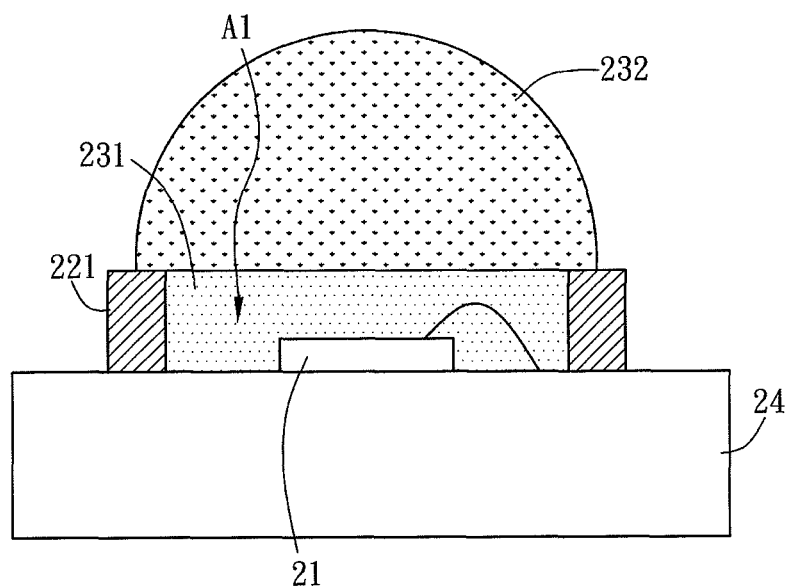
Figure 2C:
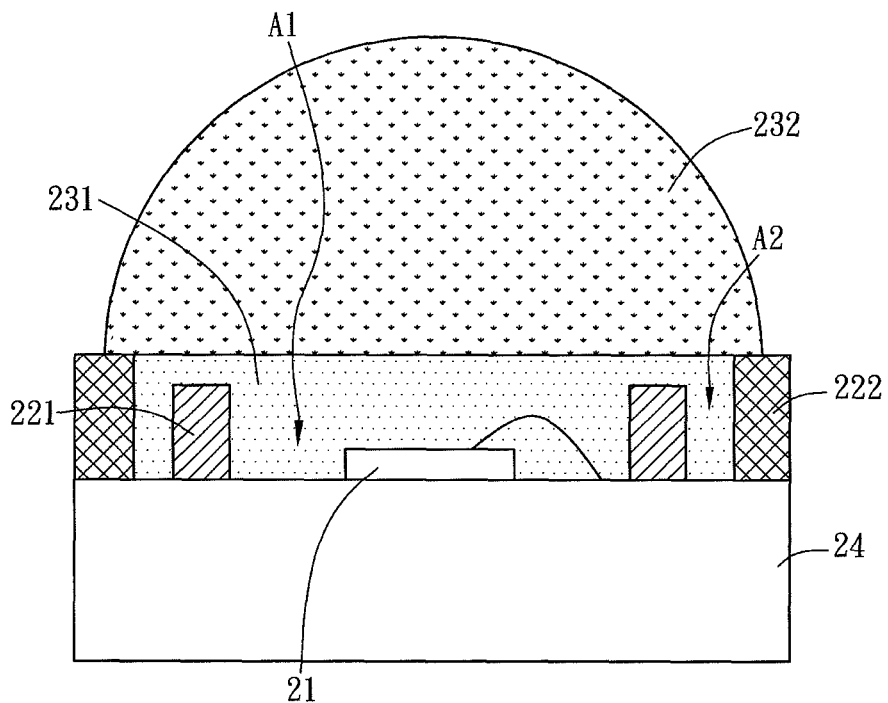
Figure 2D:
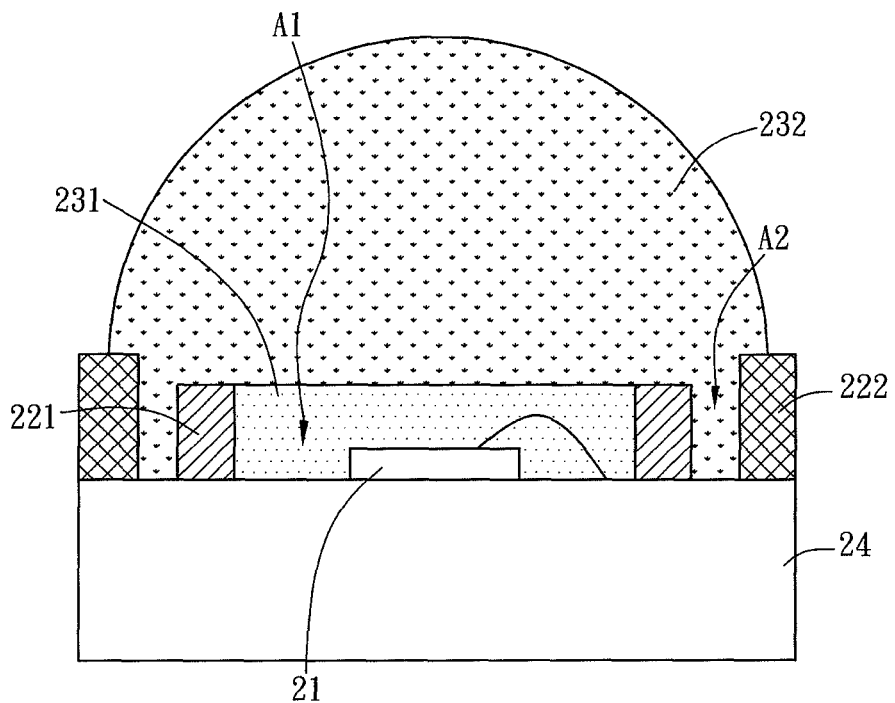
Figure 2E:
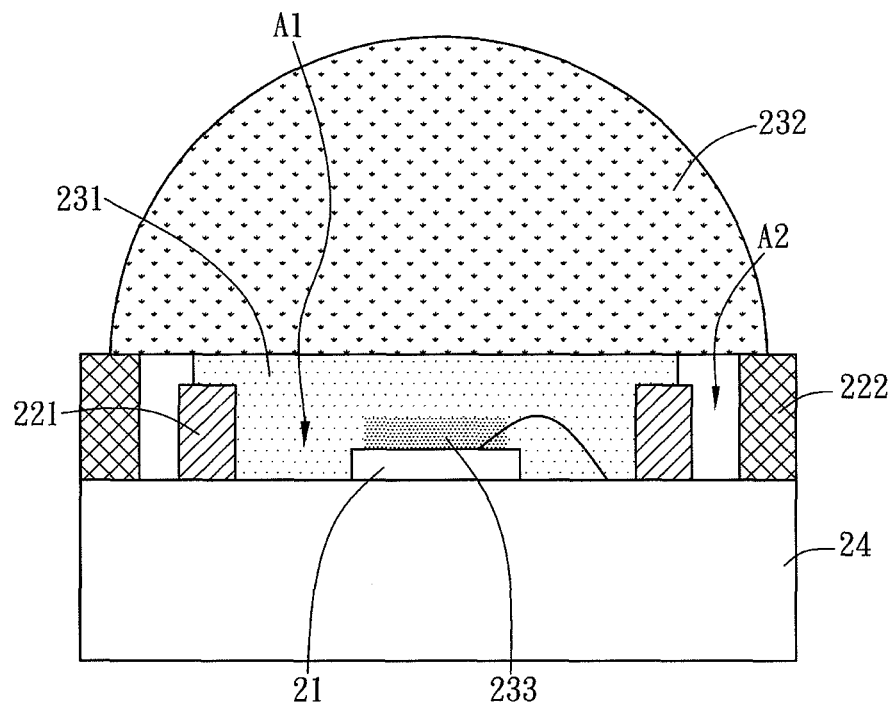
Figure 2F:
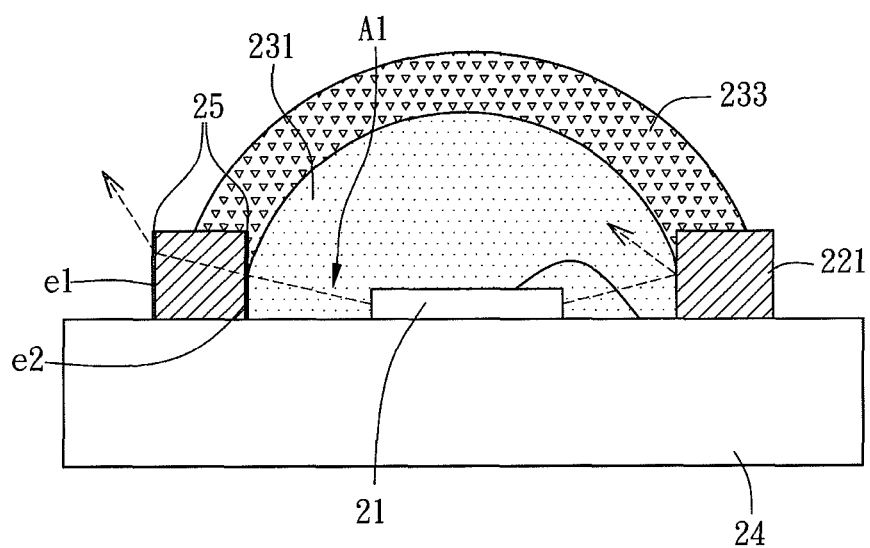

As shown in FIG. 2F, each of the first barricade 221 or the second barricade individually has a first end e1 close to the illuminating element 21 and a second end e2 opposite to the first end e1 and away from the illuminating element 21. The first end e1 and/or second end e2 can be individually coated with a light-refraction-index converting material 25, which can cause change of light refraction index depending on requirements. Moreover, the first barricade 221 or the second barricade also can be used to reflect the light emitted from the illuminating element 21.

The cover layer of the illuminating device of the present invention can be an optical lens layer, a gel layer, a composite material layer or a multilayer structure composed of their combination. As shown in FIG. 2B, a gel layer 231 is disposed in the first accommodating area A1, and the height of the gel layer 231 is equal to that of the first barricade 221. Then, the optical lens layer 232 is disposed on the gel layer 231. Otherwise, if the illuminating device has certain two-barricade structure, the gel layer 231 can be disposed in the first accommodating area A1 and second accommodating area A2 simultaneously as shown in FIG. 2C. Meanwhile, the height of the gel layer 231 is equal to that of the second barricade 222, and the optical lens 232 layer is further disposed on the gel layer 231. As shown in FIG. 2D, the gel layer 231 can only be disposed in the first accommodating area A1, and the composite material layer 233 can be disposed over the gel layer 231 and extending outwardly in the second accommodating area A2.

Moreover, as shown in FIG. 2E, the composite material layer 233 can be disposed on the illuminating element 21, and then the gel layer 231 can be disposed on the composite material layer 233 for covering the composite material layer 233 and the illuminating element 21. The optical lens layer 232 is disposed on the gel layer 231; meanwhile, the gel layer 231 is only disposed in the first accommodating area A1 and the second accommodating area is not filled with any material. The height of the gel layer 231 is higher than that of the first barricade 221. In addition, the gel layer 231 and the second barricade 222 support the optical lens layer 232 together.

The material of the optical lens layer 232 includes glass, acryl or UV gel, and the composite material layer 232 includes a filling gel and a composite material. The composite material dispersed in the filling gel uniformly, non-uniformly, with a gradually changing concentration, at the bottom, or at the top. The composite material is preferably a fluorescent material, a wavelength converting material or a non-crystal material, and the gel layer is preferably epoxy, silicone, resin or insulation material.

The illuminating device of the present invention and its packing method can simplify the packaging process and provide accurate alignment. Furthermore, with different combinations of the first barricade, the second barricade and the cover layer, it is feasible to further adjust the optical features of the illuminating device such as light emission efficiency, color temperature and light uniformity in different viewing angles.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An illuminating device, comprising:
   a substrate;
   an illuminating element disposed on the substrate;
   a first barricade protruded from a surface of the substrate, wherein the first barricade is disposed around the illuminating element to define a first accommodating area;
   at least one second barricade disposed around the first barricade continuously or discontinuously to define a second accommodating area between the first barricade and the second barricade; and at least one cover layer, comprising a gel layer, wherein the gel layer is only disposed in the first accommodating area for covering the illuminating element.

2. The illuminating device of claim 1, wherein the first barricade is disposed around the illuminating device with the same or different distances.

3. The illuminating device of claim 1, wherein the first accommodating area or the second accommodating area is annular, circular, elliptic, triangular, rectangular, polygonal or irregular.

4. The illuminating device of claim 1, wherein the height of the gel layer of the cover layer is equal to or higher than that of the first barricade.

5. The illuminating device of claim 1, wherein each of the first barricade or second barricade is spherical, ellipsoid-shaped, annular, arc-shaped, cone-shaped, cubic, polyhedron-shaped or irregularity-shaped.

6. The illuminating device of claim 1, wherein each of the first barricade or second barricade is flexible or inflexible, and the material of each of the first barricade or second barricade comprises silica gel, silicone, rubber, resin, glass, acryl, UV gel, light-permeable material, light-proof material or insulation material.

7. The illuminating device of claim 1, wherein each of the first barricade or second barricade is disposed on the substrate by dispensing, adhering, press molding or screen printing.

8. The illuminating device of claim 1, wherein each of the first barricade or second barricade reflects the light emitted from the illuminating device.

9. The illuminating device of claim 1, wherein each of the first or second barricades individually has a first end close to the illuminating element and a second end opposite to the first end and away from the illuminating element, and the first and/or second end is coated with a light-refraction-index converting material.

10. The illuminating device of claim 1, wherein the surface of the cover layer is a concave, convex, flat, mirror or rough surface.

11. The illuminating device of claim 1, wherein the cover layer further comprises an optical lens layer or a composite material layer.

12. The illuminating device of claim 11, wherein the material of the optical lens layer comprises glass, acryl, UV gel, quartz or highly light-permeable material.

13. The illuminating device of claim 11, wherein the composite material layer comprises a filling gel and a composite material, and the composite material is dispersed in the filling gel uniformly, non-uniformly, with a gradually changing concentration, at the bottom, or at the top.

14. The illuminating device of claim 13, wherein the filling gel comprises epoxy, silicone, resin or insulation material, and the composite material comprises a fluorescent material, a wavelength converting material or a non-crystal material.

15. The illuminating device of claim 11, wherein the optical lens layer is disposed on the composite material layer or the second barricade.

16. The illuminating device of claim 11, wherein the composite material layer is disposed on the illuminating element.

17. The illuminating device of claim 1, wherein the material of the substrate is copper, aluminum, ceramics or high thermal conductivity material, and the surface of the substrate is a flat, convex or concave surface.

18. The illuminating device of claim 1, wherein the surface of the substrate comprises a light reflective material.

19. The illuminating device of claim 11, wherein the composite material layer is disposed over the gel layer and extending outwardly in the second accommodating area.

20. The illuminating device of claim 11, wherein the second accommodating area is not filled with any material.

21. An illuminating device, comprising:
a substrate;
an illuminating element disposed on the substrate;
a first barricade protruded from a surface of the substrate, wherein the first barricade is disposed around the illuminating element to define a first accommodating area;
a second barricade disposed around the first barricade to define a second accommodating area between the first barricade and the second barricade; and
at least one cover layer, comprising an optical lens layer or a gel layer, wherein the gel layer is disposed in the first accommodating area for covering the illuminating element, and the optical lens layer is disposed on the gel layer, the first barricade or the second barricade,
wherein the height of the cover layer is equal to or higher than that of the second barricade, and the gel layer of the cover layer is only disposed in the first accommodating area.

* * * * *